United States Patent
Kim et al.

[11] Patent Number: 6,087,232
[45] Date of Patent: Jul. 11, 2000

[54] FABRICATION METHOD OF LATERAL DOUBLE DIFFUSED MOS TRANSISTORS

[75] Inventors: Jong Dae Kim; Sang Ki Kim; Jin Gun Koo; Kee Soo Nam, all of Daejeon, Rep. of Korea

[73] Assignee: Electronics and Telecommunications Research Institute, Daejeon, Rep. of Korea

[21] Appl. No.: 09/135,645

[22] Filed: Aug. 18, 1998

[30] Foreign Application Priority Data

Oct. 28, 1997 [KR] Rep. of Korea ................ 97-55546

[51] Int. Cl.$^7$ ................................................ H01L 21/336
[52] U.S. Cl. .................... 438/289; 438/286; 438/297; 438/276
[58] Field of Search .................. 438/297, 276, 438/289, 286, 298; 148/DIG. 126

[56] References Cited

U.S. PATENT DOCUMENTS

| | | | |
|---|---|---|---|
| 5,346,835 | 9/1994 | Malhi et al. | 438/289 |
| 5,508,547 | 4/1996 | Yang . | |
| 5,512,495 | 4/1996 | Mei et al. | 438/286 |
| 5,548,147 | 8/1996 | Mei | 257/333 |
| 5,585,294 | 12/1996 | Smayling et al. . | |
| 5,585,660 | 12/1996 | Mei | 257/389 |

FOREIGN PATENT DOCUMENTS

| | | |
|---|---|---|
| 0562352 | 9/1993 | European Pat. Off. . |
| 2150746 | 7/1985 | United Kingdom . |
| 2295051 | 5/1996 | United Kingdom . |

OTHER PUBLICATIONS

Double RESURF Device Technology for Power ICs; Yukimasa Koishikawa; Mitsuasa Takahashi; Hiroshi Yanagigawa and Toshihide Kuriyama; 1994; pp. 438–443.

Novel Silicon–on–Insulator Mosfet for High–Voltage Integrated Circuits; K.A. Fesler; B.Y. Kim; H.J. Shaw; 1989; pp. 536–537.

Novel High–Voltage Silicon–on–Insulator Mosfets; Qin Lu, P. Ratnam and C. Andre T. Salama; 1992; pp. 1745–1750.

Optimized 25V, 0.34mΩ·cm$^2$ Very–Thin–RESURF(VTR), Drain Extended IGFETs in a Compressed BiCMOS Process; Chin–Yu Tsai, John Arch, Taylor Efland, John Erdeljac, Lou Hutter, Jozef Mitros, Jau–Yuann Yang and Han–Tzong Yuan; 1996; pp. 18.2.1–18.2.4.

An Optimized RESURF LDMOS Power Device Module Compatible with Advanced Logic Processes; Taylor Efland, Satwinder Malhi, Wayne Bailey, Oh Kyong Kwon, Wai Tung Ng, Manolo Torreno and Steve Keller; 1992; pp. 9.4.1–9.4.4.

A Resurfed High–Voltage NMOS Device Fully Compatible With A Low–Voltage 0.8μm BiCMOS Technology; Yong Qiang Li, C. Andre T. Salama, Mike Seufert, Peter Schvan and Mike King; 1996; pp. 571–576.

Thin Layer High–Voltage Devices (Resurf Devices); J.A. Appels, M.G. Collet, P.A.H. Hart, H.M.J. Vaes and J.F.C.M. Verhoeven; 1980; pp. 1–13.

*Primary Examiner*—Charles Bowers
*Assistant Examiner*—David S Blum
*Attorney, Agent, or Firm*—Antonelli, Terry, Stout & Kraus, LLP

[57] ABSTRACT

According to a method for manufacturing double RESURF (reduced SURface Field) LDMOS (Lateral Diffused Metal Oxide Semiconductor) transistors, on-resistance of double RESURF LDMOS transistors has been improved by using a new tapered p top layer on the surface of the drift region of the transistor, thereby decreasing the length of the drift region. Another advantage of the current invention is that the breakdown voltage similar with the on-resistance can be improved by using a reproducible tapered TEOS oxide by use of a multi-layer structure and low temperature annealing process. This is due to the reducing of the current path and impurity segregation in the drift region by using the tapered TEOS oxide instead of LOCOS filed oxide.

5 Claims, 5 Drawing Sheets

FABRICATION METHOD OF LATERAL DOUBLE DIFFUSED MOS TRANSISTORS

BACKGROUND OF THE INVENTION

1. Field of the Invention

The present invention relates generally to a method of making an LDMOS (Lateral Double-diffused Metal Oxide Semiconductor) transistor, and more particularly to a method of producing an LDMOS transistor using a tapered P-type region.

2. Description of the Related Art

Power semiconductor devices are currently being used in many applications. A commonly used high-voltage component for these circuits is the LDMOS transistor. The LDMOS transistor structure has been widely used in intelligent power applications. It has the advantages of process compatibility with VLSI process and is easily integrated with other processing.

For power devices, a specific "on" resistance and breakdown voltage are critical to device performance. The main objective of the design of the LDMOS device is to minimize "on" resistance, while still maintaining high breakdown voltages. However, these two electrical parameters tend to have conflicting requirements as far as processing variables such as epitaxial doping and thicknesses are concerned.

To this end, a double RESURF (REduced SURface Field) structure has been proposed. FIGS. 1(a) to 1(e) are schematic cross-sectional process flow diagrams illustrating the major steps in processing a double RESURF to fabricate LDMOS transistors in accordance with the conventional art.

Referring to FIG. 1(a), on a p-type silicon substrate 10, a p-type epitaxial layer 11 is formed, and then an n-type drift region 12 is formed on the p epitaxial layer 11 by ion implantation process. A p-type top layer 13 is formed into the n drift region 12 by an ion implanting using a mask pattern 101 as a mask and a drive-in process.

Then, a LOCOS (LOCal Oxidation) process for forming field oxides is carried out. Firstly, as shown in FIG. 1(b), a pad oxide layer 14 and a nitride pattern 102 are sequentially formed on the resultant structure after the mask pattern 101 is removed. Secondly, the opened pad oxide 14 is grown by oxidation process at high temperature of 1000 degree Celsius or more, and then a field oxide 15 is formed, as shown in FIG. 1(c). Then, the remaining pad oxide layer 14 is removed.

Referring to FIG. 1(d), a gate conductive layer 16 is formed. Then, an N+ source region 17 is formed in the exposed n drift region 12 by ion implanting, and N+ drain region 18 and P+ region are formed in the exposed p-type epitaxial layer 11, respectively.

Referring to FIG. 1(e), on the entire surface of resultant structure, an interlayer dielectric 19 is formed, and then opening process are carried out using a mask pattern 103 as an etching mask.

As described above, in this double RESURF structure the p top layer 13 is introduced in the n drift region 12. The p top layer 13 helps the n drift region 12 to be easily depleted even if the concentration of the n drift region 12 is set high enough to reduce the on-resistance. That is, the double depletion region are formed between the p epitaxial layer 11 and the n drift region 12 and between the n drift region 12 and the p top layer 13, respectively. As a result, the on-resistance is improved.

However, in the aforementioned double RESURF structure using the p top layer 13, the length of the drift region 12 is significantly increased since the p top layer 13 is formed by the sophisticated ion implanting and drive-in process of high temperature, thereby causing to increase the on-resistance of devices in the conventional method. Additionally, the conventional method has disadvantages in that it raises an out-diffusion of dopants in the drift region 12 and the p top layer 13 due to the high temperature oxidation for forming the field oxide 15.

Thus, what is needed is to develop double RESURF structure with improved p top layer to be able to fabricated without high temperature drive-in and oxidation processes causing the increasement of the drift region and out diffusion of dopant.

Ultimately, the conventional double RESURF LDMOS technologies are disadvantageous in that high breakdown voltage cannot coexist with low on-resistance.

SUMMARY OF THE INVENTION

It is, therefore, desirable to be able to fabricate double RESURF LDMOS devices that have an improved on-resistance while maintaining a high breakdown voltage.

It is also desirable to be able to fabricate such an improved LDMOS device using a simple process that is consistent with the manufacturing of other high power devices.

According to a preferred embodiment of this invention, there is provided a method for manufacturing a double RESURF LDMOS devices comprising the steps of: forming a drift region of a second conductive type in an epitaxial layer of first conductive type having a silicon substrate of same conductive type; sequentially forming a pad oxide and a nitride pattern; forming a field oxide and a convex region underlying the nitride pattern using an LOCOS (local oxidation) process using the nitride pattern as a mask, and removing the nitride pattern; forming a tapered top layer of first conductive type on the surface of said drift region using said field oxide as an ion-implanting mask; forming a TEOS oxide pattern of multi-layer structure using a chemical vapor deposition (CVD) method for exposing the portion of said epitaxial layer, said drift region and said top layer; and forming a gate electrode and source/drain regions.

Preferably, the TEOS oxide made of three-layer structure have etching rates which are different from each other. The TEOS oxide of three-layer structure consists of a thermally grown oxide, a thick TEOS oxide layer and a thin TEOS oxide layer, and the etch rate of the thin TEOS oxide of upper layer is faster than that of the thick TEOS oxide of lower layer.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings are only for the purpose of illustrating a preferred embodiment of the invention and are not to be construed as limiting the invention.

DESCRIPTION OF THE PREFERRED EMBODIMENTS

Figure 2A:
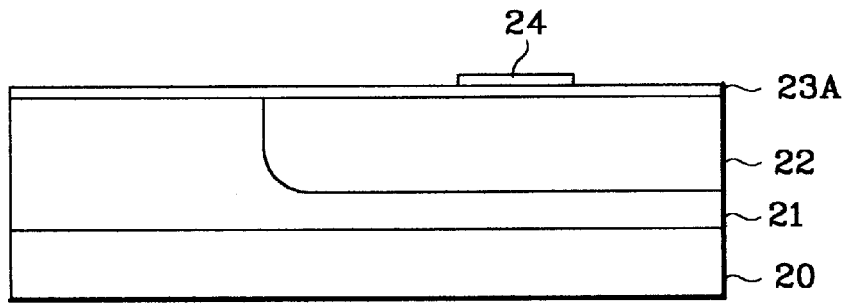
FIGS. 2(*a*)–2(*h*) are schematic cross-sectional process flow diagrams illustrating the steps in processing double RESURF structure to fabricate an LDMOS device in accordance with the present invention.
Figure 2B:
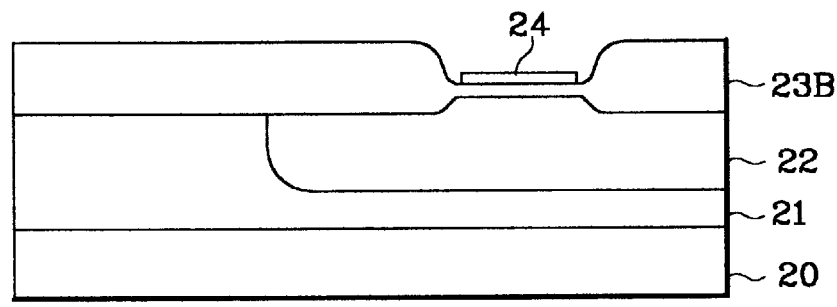
Figure 2C:
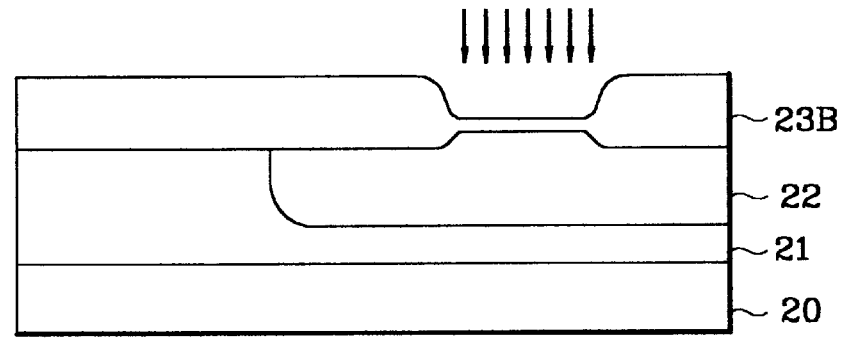
Figure 2D:
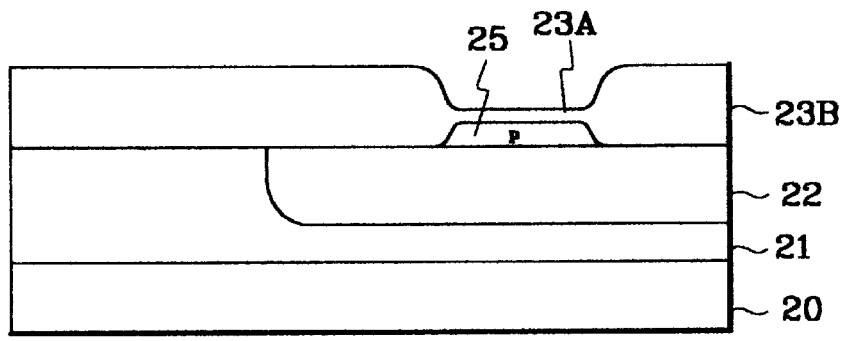
Figure 2E:
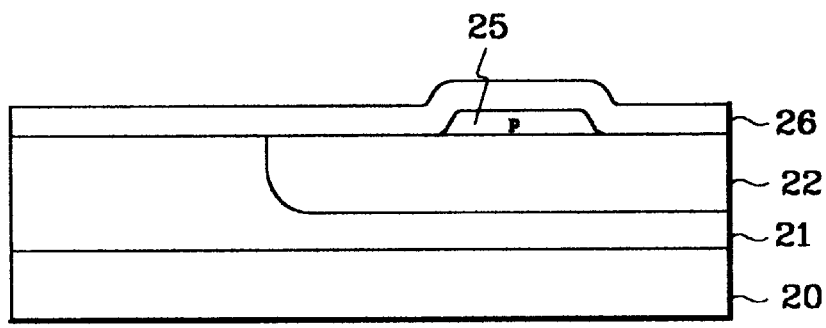
Figure 2F:
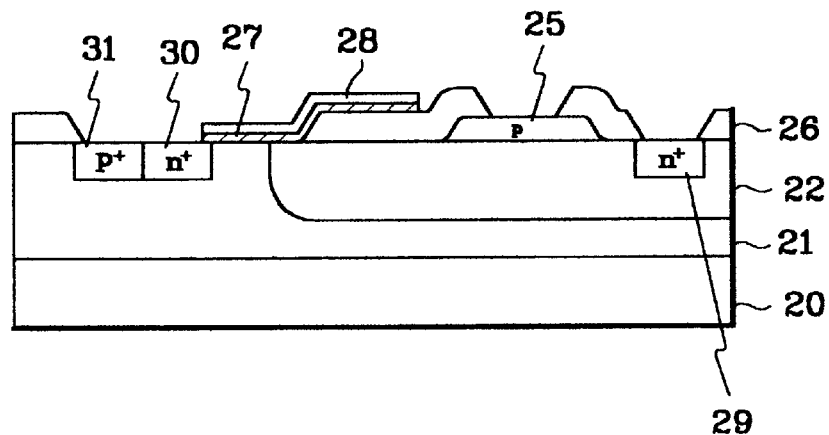
Figure 2G:
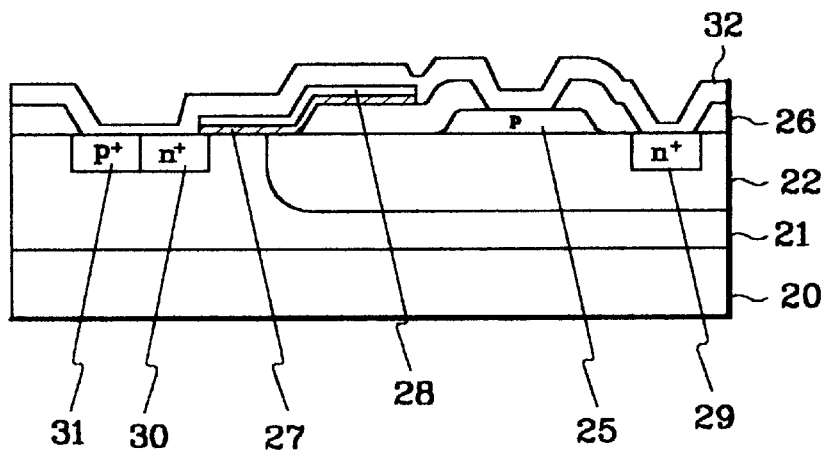
Figure 2H:
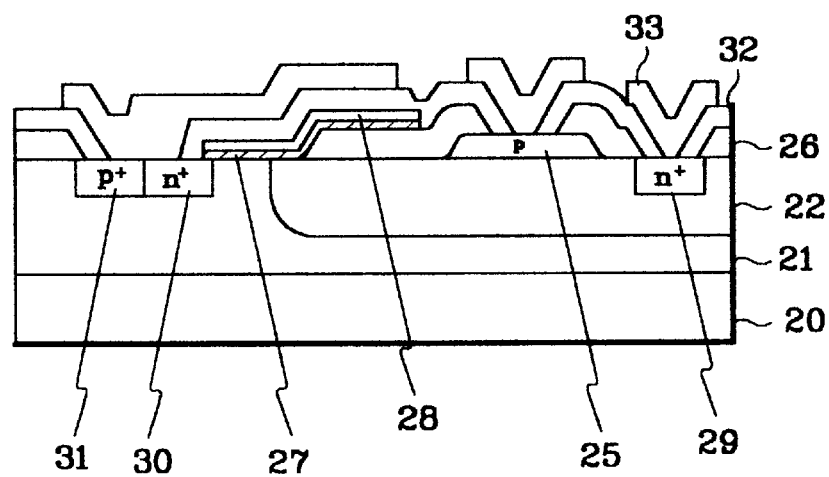

Referring now to FIGS. 2(*a*)–2(*h*), a preferred embodiment of this invention will be described in detail.

As shown in FIG. 2(*a*), on a p-type silicon substrate 20, a p-type epitaxial layer 21 is grown. Next, an n-type drift region 22 is formed into the epitaxial layer 21 using an ion implanting. Then, for forming a field oxide, a pad oxide layer 23A and a nitride pattern 24 are sequentially formed on the surface of the resultant structure.

Referring to FIG. 2(*b*), a field oxide layer 23B is formed over the exposed pad oxide layer 23A using a thermal oxidation such as standard LOCOS process. At this time, the drift region 22 underlying the nitride pattern 24 which is used as a mask of the LOCOS process has a convex portion.

Referring now to FIG. 2(*c*), after the nitride pattern 24 is removed, the p-type implant is then conducted using the field oxide 23B as an ion-implanting mask, preferably with boron ions at a dose of about $5 \times 10^{11}$ to $1 \times 10^{12}$ ions/cm$^2$ and at an energy of about 60 to 80 KeV. This implant dose is carefully controlled so that the RESURF principle is satisfied.

Figure 1A:
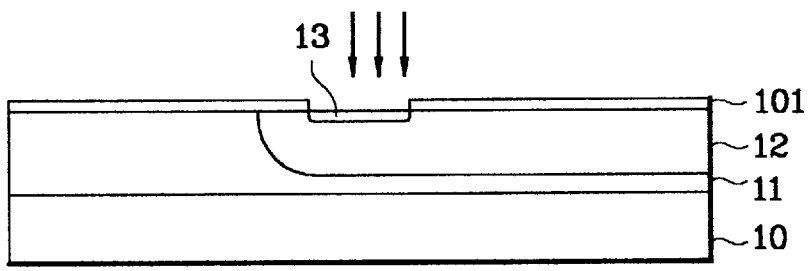
FIGS. 1(a)–1(e) are schematic cross-sectional process flow diagrams illustrating the steps in processing double RESURF structure to fabricate an LDMOS device in accordance with the conventional art.
Figure 1B:
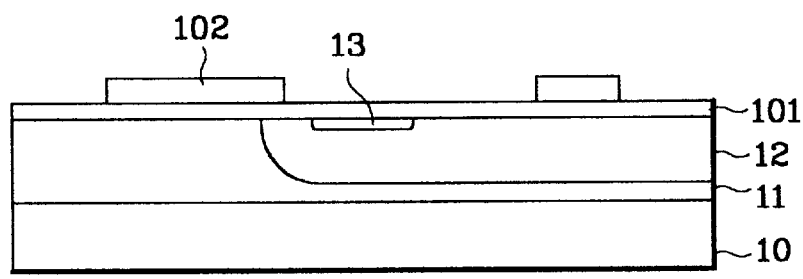
Figure 1C:
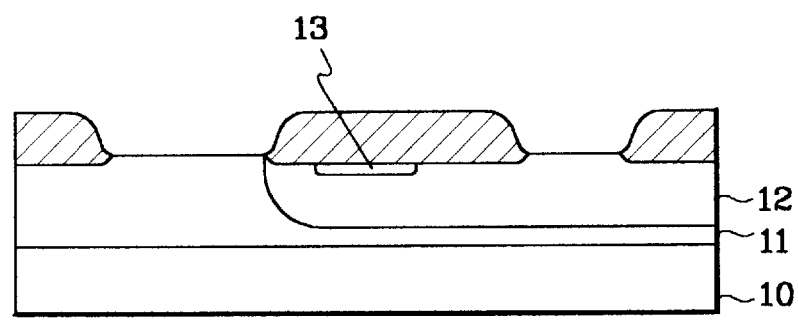
Figure 1D:
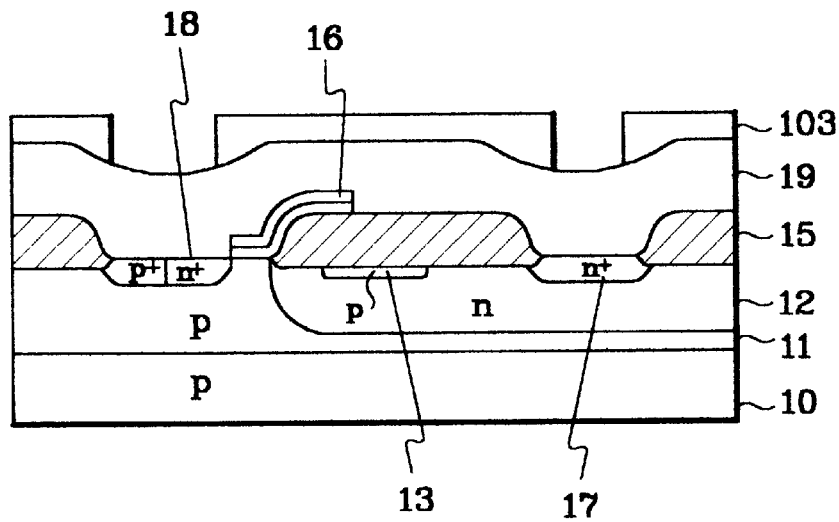
Figure 1E:
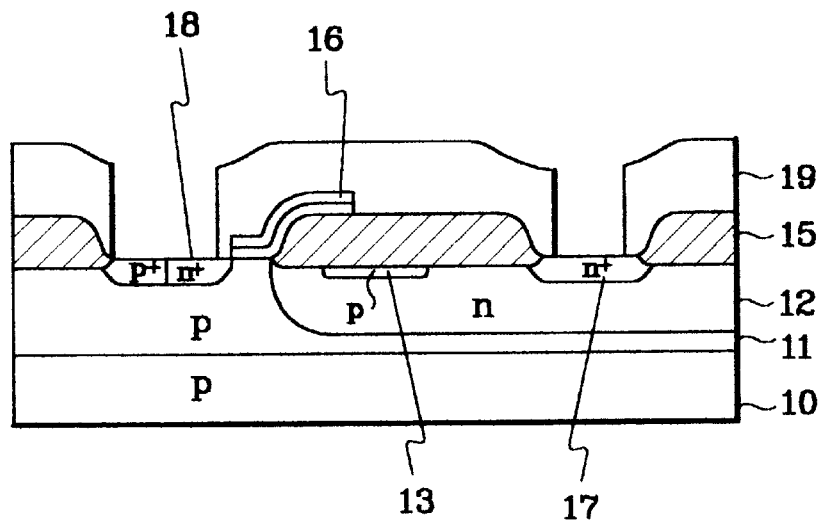

This creates a tapered p top region 25 on the upper part 10 of the drift region 22 as shown in FIG. 2(*d*). Compared to the conventional double RESURF LDMOS transistors in which the p top region 13 is formed within the drift region 12 (shown in FIG. 1), the tapered p top region 25 in accordance with this embodiment is formed on the surface of the drift region 22 by using the convex portion formed by LOCOS process. Therefore, the increasing of the drift region 22 is exceedingly prevented. As a result, the on-resistance of the LDMOS device can be improvement.

Next, as shown in FIG. 2(*e*), the field oxide layer 23B and the remaining pad oxide layer 23A are removed, and then a TEOS oxide layer 26 is formed on the entire surface of the resultant structure. The formation of the TEOS oxide 26 uses a TEOS deposition technology such as a chemical vapor deposition (CVD) method.

Preferably, the CVD or TEOS oxide 26 made of multi-layer oxide. For example, the CVD oxide 26 of the multi-layer structure include first thermal oxide having a thickness of about 200 to 500 Å, second thick TEOS oxide having a thickness of about 5000 to 8000 Å annealed at 850° C., and third thin TEOS oxide having a thickness of about 2000 to 3000 Å. At this time, an etching rate of these oxide layers is different from each other so that it uses a tapered etching.

Next, an opening process is performed, as depicted in FIG. 2(*f*). The CVD oxide layers 26 are sequentially etched so as to partially expose the tapered p top region 25, the n drift region 22 and the epitaxial layer 21. At this time, in the double-layer structure of the thick TEOS/thin TEOS, the upper layer is etched extremely fast in the buffered HF solution, while the etch rate of the lower layer is slow. This tapered etching method is very simple and low temperature process, compared to conventional art.

It is well known that the LOCOS process of silicon at high temperature causes redistribution of impurities at the silicon-silicon dioxide interface. Therefore, the thermal oxidation at high temperature performs very important role in making a device optimization. In the present invention, by using the tapered TEOS oxide technique instead of the conventional LOCOS field oxide, out-diffusion of dopants into the oxide is extremely decreased.

Continuously, on the partial portion of the CVD oxide 26 and the epitaxial layer 21, a gate oxide layer 27 and a polysilicon gate pattern 28 are sequentially formed. Then, an n+ drain region 29 and an n+ source region 30 are formed in the exposed drift region 22 and the exposed epitaxial layer 21, respectively, using n+ source/drain implant, which is preferably an arsenic implantation with a dose of about $5 \times 10^{15}$ ions/cm$^2$. Next, a p+ contact region 31 is formed in the exposed epitaxial layer 21. These two implantations are annealed.

Referring now to FIG. 2(*g*), on the entire surface of the resultant structure, an interlayer dielectric film 32 is deposited, and then the interlayer dielectric film 32 is selectively etched in order to obtain openings in the n+ source and drain region 30 and 29, the p+ contact region 31 and the p top region 25.

FIG. 2(*h*) is showing the final step of forming a metal interconnection 33.

As described above, according to the preferred embodiment of the current invention, on-resistance of double RESURF LDMOS transistors has been improved by using a new tapered p top layer on the surface of the drift region of the transistor, thereby decreasing the length of the drift region.

Another advantage of the current invention is that the breakdown voltage similar with the on-resistance can be improved by using a reproducible tapered TEOS oxide by use of a multi-layer structure and low temperature annealing process. This is due to the reducing of the current path and impurity segregation in the drift region by using the tapered TEOS oxide instead of LOCOS filed oxide.

Also, the current invention can be easily manufactured a double RESURF LDMOS device having a low on resistance and a high breakdown voltage. In other words, the present invention has advantageous in that high breakdown voltage can coexist with low on resistance.

Although the present invention and its advantages have been described in detail, it should be understood that various changes, substitutions and alterations may be made herein without departing from the spirit and scope of the invention, as defined by the appended claims.

What is claimed is:

1. A method for manufacturing a double RESURF (Reduced SURface Field) LDMOS (Lateral Double-diffused Metal Oxide Semiconductor) devices, said method comprising the steps of:

(a) forming a drift region of a second conductive type in an epitaxial layer of a first conductive type having a silicon substrate of a same conductive type;

(b) sequentially forming a pad oxide and a nitride pattern;

(c) forming a field oxide and a convex region underlying the nitride pattern using an LOCOS (local oxidation) process used the nitride pattern as a mask, and removing the nitride pattern;

(d) forming a tapered top layer of the first conductive type on the surface of said drift region using said field oxide as an ion-implanting mask;

(e) forming a TEOS oxide pattern of multi-layer structure using a chemical vapor deposition (CVD) method for exposing the portion of said epitaxial layer, said drift region and said top layer; and (f) forming a gate electrode and source/drain regions.

2. A method for making double RESURF LDMOS transistor of claim 1, wherein said TEOS oxide is made of a three-layer structure each having an etching rate which is different from each other.

3. A method for making double RESURF LDMOS transistor of claim 2, wherein said TEOS oxide of three-layer structure consists of a thermally grown oxide, a thick TEOS oxide layer and a thin TEOS oxide layer.

4. (Amended) A method for making double RESURF LDMOS transistor of claim 3, wherein the etching rate of said thin TEOS oxide of upper layer is faster than that of the thick TEOS oxide of lower layer.

5. A method for making double RESURH\F LDMOS transistor of claim 3, wherein a thickness of the thermal oxide ranges from 200 to 500 Å, a thickness of the TEOS oxide annealed at 850° C. ranges from 5000 to 8000 Å, and a thickness of the thin TEOS oxide ranges from 2000 to 300 Å.

* * * * *